United States Patent
Hasegawa et al.

(10) Patent No.: US 7,268,978 B2
(45) Date of Patent: Sep. 11, 2007

(54) SELF-PINNED MAGNETIC DETECTING ELEMENT

(75) Inventors: Naoya Hasegawa, Niigata-ken (JP); Masamichi Saito, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 312 days.

(21) Appl. No.: 11/156,980

(22) Filed: Jun. 20, 2005

(65) Prior Publication Data
US 2005/0280953 A1    Dec. 22, 2005

(30) Foreign Application Priority Data
Jun. 21, 2004    (JP)    ............... 2004-182322

(51) Int. Cl.
*G11B 5/33*    (2006.01)
(52) U.S. Cl. .................................. 360/324.1
(58) Field of Classification Search ............ 360/324.1, 360/324.11
See application file for complete search history.

(56) References Cited

U.S. PATENT DOCUMENTS

| | | | |
|---|---|---|---|
| 5,583,725 A | 12/1996 | Coffey et al. | |
| 6,256,222 B1 * | 7/2001 | Sakakima et al. | ........... 365/158 |
| 7,045,224 B2 * | 5/2006 | Hasegawa et al. | ........ 428/811.5 |
| 7,126,797 B2 * | 10/2006 | Hasegawa et al. | ........ 360/324.1 |
| 7,220,499 B2 * | 5/2007 | Saito et al. | ............... 428/811.5 |

FOREIGN PATENT DOCUMENTS

| | | |
|---|---|---|
| JP | 2002-092826 | 3/2002 |
| JP | 2002-150512 | 5/2002 |
| JP | 2002-319112 | 10/2002 |
| JP | 2003-031867 | 1/2003 |

* cited by examiner

*Primary Examiner*—Angel Castro
(74) *Attorney, Agent, or Firm*—Brinks Hofer Gilson & Lione

(57) ABSTRACT

A CPP magnetic detecting element having a pinned magnetic layer whose magnetization is fixed by its uniaxial anisotropy in a structure that CIP magnetic detecting elements do not allow. In the CPP magnetic detecting element, the upper and lower surfaces of a pinned magnetic layer is disposed between nonmagnetic metal magnetostriction-enhancing layers. CPP magnetic detecting elements allow this structure without degrading the GMR effect. Thus, the magnetostriction coefficient of the pinned magnetic layer can be increased from above and below to produce an appropriate magnetoelasticity. Consequently, the magnetization of the pinned magnetic layer can be more firmly fixed.

13 Claims, 7 Drawing Sheets

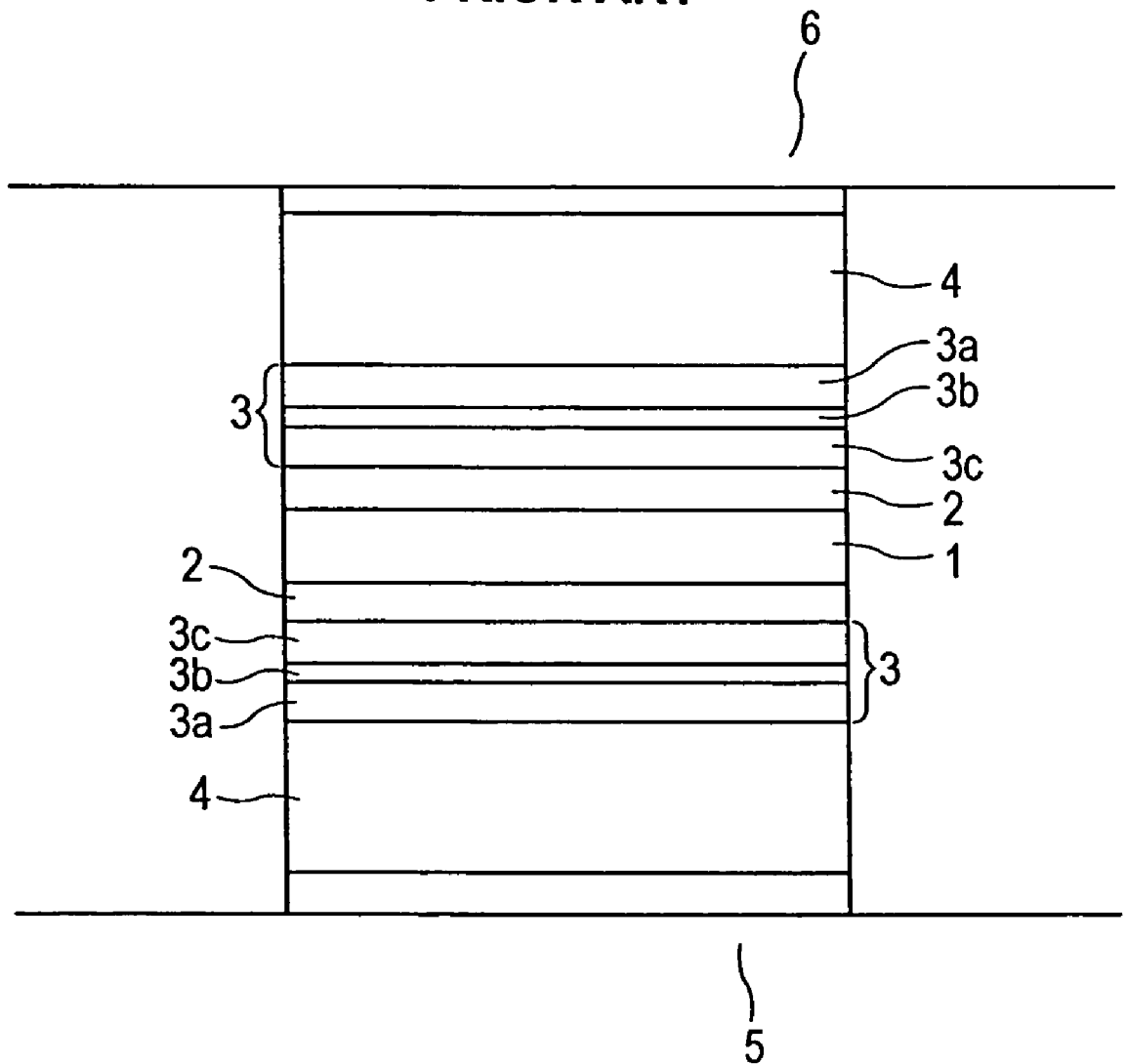

SELF-PINNED MAGNETIC DETECTING ELEMENT

This application claims the benefit of priority to Japanese Patent Application No. 2004-182322, filed on Jun. 21, 2004, herein incorporated by reference.

BACKGROUND OF THE INVENTION

1. Field of the Invention

The present invention relates to CPP (current-perpendicular-to-the-plane) magnetic detecting elements, and particularly to a CPP magnetic detecting element having a structure which CIP (current-in-the-plane) magnetic detecting elements do not allow and in which the magnetization of a pinned magnetic layer is more firmly fixed by the uniaxial anisotropy of the pinned magnetic layer.

2. Description of the Related Art

A magnetic detecting element having a multilayer composite including a free magnetic layer, a nonmagnetic material layer, and a pinned magnetic layer may be of a CIP type or a CPP type, according to the direction of current flowing in the multilayer composite.

In a CIP magnetic detecting element, current flows in a direction parallel to the surfaces of the layers of the multilayer composite. In a CPP magnetic detecting element, current flows in the direction perpendicular to the surfaces of those layers.

The CPP magnetic detecting element generally has an advantage that the size can be reduced to increase the reproduction power in comparison with the CIP magnetic detecting element. It is therefore believed that the CPP magnetic detecting element has a structure capable of achieving a high density recording, and that it can be used in place of the currently dominating CIP magnetic detecting element.

In order to put the CPP magnetic detecting element into practical use to achieve a high density recording, the rate of change in resistance ($\Delta R/R$) is desirably increased. Japanese Unexamined Patent Application Publication No. 2002-92826 has taught that a multilayer structure defining a pinned layer P or a free layer F, constituted of a magnetic layer FF and a nonmagnetic layer FN produces an electron scattering effect, that is, the resistance at the interface between the magnetic layer FF and the nonmagnetic layer FN has large spin dependency and increases the CPP magnetoresistance (CPP-MR) (see, for example, paragraph [0048] in the specification of this publication).

FIG. 10 of this publication shows a multilayer structure constituted of a first nonmagnetic layer SN1 and a second nonmagnetic layer SN2, defining a nonmagnetic interlayer S disposed between the pinned layer P and the free layer F.

Japanese Unexamined Patent Application Publication No. 8-7235 has disclosed a technique for fixing the magnetization of a pinned magnetic layer by the uniaxial anisotropy of the pinned magnetic layer. The disadvantages of this technique will be described later.

Known CPP magnetic detecting elements, including the CPP magnetic detecting element of Japanese Unexamined Patent Application Publication No. 2002-92826, have the following disadvantages.

FIG. 10 is a schematic diagram of the structure of a known CPP magnetic detecting element. The CPP magnetic detecting element includes a multilayer composite and electrodes 5 and 6 disposed on the top and the bottom of the multilayer composite. The multilayer composite includes nonmagnetic material layers 2, pinned magnetic layers 3, and antiferromagnetic layers 4 disposed in that order over and under a free magnetic layer 1.

In this structure, each pinned magnetic layer 3 is composed of three sublayers: two magnetic layers 3a and 3c and a nonmagnetic interlayer 3b between the magnetic layers 3a and 3c. The magnetic layers 3a and 3c are magnetized antiparallel to each other. Such a multilayer structure is called the artificial ferrimagnetic structure.

The antiferromagnetic layer 4 has a specific resistance as high as, for example, about 200 $\mu\Omega\cdot cm^2$ (or more), and generates Joule heat when a current is applied to the electrodes 5 and 6. The Joule heat causes lattice vibration of conduction electrons in the adjacent pinned magnetic layer 3, the nonmagnetic material layer 2, and the free magnetic layer 1, thereby making the phonon scattering and electromigration vigorous.

It is considered that the rate of change in resistance ($\Delta R/R$) of the CPP magnetic detecting element is closely related to the spin-dependent bulk scattering effect. In the structure shown in FIG. 10, the $\Delta R/R$ value depends on the magnetic layer 3c adjoining the nonmagnetic material layer 2 among the free magnetic layer 1 and the layers constituting the pinned magnetic layer 3. In order to increase the $\Delta R/R$ value, it is necessary that the difference in spin diffusion length between the up-spin conduction electrons and down-spin conduction electrons in the magnetic layer 3c be increased by setting the spin-dependent bulk scattering coefficient $\beta$ of the magnetic layer 3c to be positive so that, in the magnetic layer 3c, the up-spin conduction electrons can easily flow while the down-spin conduction electrons can be easily scattered.

However, it has been found that the above-mentioned lattice vibration of conduction electrons causes phonon scattering to scatter the conduction electrons independently of the spin states, and that consequently the GMR effect represented by the $\Delta R/R$ value cannot be appropriately enhanced.

Furthermore, in the structure shown in FIG. 10, the presence of the thick antiferromagnetic layers 4 increases the gap between the electrodes 5 and 6. This makes it impossible to appropriately increase the recording density (more specifically, track recording density) of recording media.

One approach for enhancing the GMR effect of the CPP magnetic detecting element is to eliminate the antiferromagnetic layers 4 from the multilayer composite. In this instance, the magnetization of the pinned magnetic layers needs to be appropriately fixed without the antiferromagnetic layers.

The above-cited Japanese Unexamined Patent Application Publication No. 8-7235 has disclosed a technique for fixing the magnetization of a pinned magnetic layer by the uniaxial anisotropy of the pinned magnetic layer, without an antiferromagnetic layer.

However, the magnetic detecting element of this publication is of a CIP type, and there is no mention of how the magnetization of the pinned magnetic layer is fixed in a CPP magnetic detecting element. In addition, the pinned ferromagnetic layer (pinned magnetic layer) of this publication is deposited on a buffer layer made of tantalum, which is liable to turn amorphous and whose specific resistance is high. If such a buffer layer is used in a CPP magnetic detecting element, it probably generates heat as the known antiferromagnetic layer does, thereby causing conduction electrons to scatter independently of the spin states. Hence, the GMR effect cannot be enhanced. Furthermore, Japanese Unexamined Patent Application Publication No. 8-7235 has not clearly disclosed the principle of how the tantalum buffer layer firmly fixes the magnetization of the pinned ferromagnetic layer. Therefore, the structure of this publication cannot be directly applied for the structure of the CPP magnetic detecting element.

Probably, the rate of change in resistance ($\Delta R/R$) of the CIP magnetic detecting element is closely related to the spin-dependent interface scattering, unlike the $\Delta R/R$ value of the CPP magnetic detecting element. If the structure of the interface between the nonmagnetic material layer and the pinned magnetic layer is changed in the CIP magnetic detecting element, there is a high risk of reducing the $\Delta R/R$ value. It should be avoided to change the interface structure. In general, a nonmagnetic material layer is formed of Cu and a pinned magnetic layer is formed of a CoFe alloy or the like. Since the Cu/CoFe interface produces an excellent spin-dependent interface scattering effect, it is impractical that, for example, another layer is disposed between the Cu layer and the CoFe layer to modify the Cu/CoFe interface structure of the CIP magnetic detecting element.

In the CPP magnetic detecting element, on the other hand, the $\Delta R/R$ value is, probably, related to the spin-dependent bulk scattering rather than the spin-dependent interface scattering. The inventors of the present invention have thought that the CPP magnetic detecting element allows of modification of the interface structure between the nonmagnetic material layer 2 and the pinned magnetic layer 3 (magnetic layer 3c) shown in FIG. 10 for more firmly fixing the magnetization of the pinned magnetic layer 3, unlike the CIP magnetic detecting element.

SUMMARY OF THE INVENTION

The present invention has been made in view of the above circumstances, and provides a CPP magnetic detecting element having a structure which CIP magnetic detecting elements do not allow and in which the magnetization of the pinned magnetic layer is more firmly fixed by the uniaxial anisotropy of the pinned magnetic layer.

The magnetic detecting element of the present invention includes a multilayer composite constituted of a plurality of layers in which current flows in the direction perpendicular to the surfaces of the layers. The multilayer composite includes a free magnetic layer, a nonmagnetic material layer, and a pinned magnetic layer including a plurality of magnetic layers and at least one nonmagnetic interlayer separating the magnetic layers from one another. The magnetic layer located most distant from the nonmagnetic material layer is defined as a first magnetic layer and the magnetic layer located closest to the nonmagnetic material layer is defined as a second magnetic layer. The multilayer composite also includes a first magnetostriction-enhancing layer made of a nonmagnetic metal, disposed on the surface opposite to the nonmagnetic material layer of the first magnetic layer and a second magnetostriction-enhancing layer made of a nonmagnetic metal, disposed between the second magnetic layer and the nonmagnetic material layer, in contact with the second magnetic layer. The upper surface and the lower surface of the pinned magnetic layer lie between the first magnetostriction-enhancing layer and the second magnetostriction-enhancing layer. At least part of crystals in the first magnetostriction-enhancing layer and the first magnetic layer and at least part of crystals in the second magnetostriction-enhancing layer and the second magnetic layer are present in an epitaxial state or a heteroepitaxial state. The surface opposing a recording medium of the pinned magnetic layer is open.

The magnetic detecting element of the present invention is a so-called self-pinned CPP magnetic detecting element in which the magnetization of the pinned magnetic layer is fixed by the uniaxial anisotropy of the pinned magnetic layer itself.

The CPP magnetic detecting element does not have an antiferromagnetic layer having a high specific resistance. Thus, it can prevent spin-independent scattering of conduction electrons caused by heat generation, and enhance the GMR effect, in comparison with the known CPP magnetic detecting element having a thick antiferromagnetic layer. Consequently, the reliability in energization can be increased. In addition, since the distance between shield layers disposed at the top and bottom of the CPP magnetic detecting element can be reduced, the CPP magnetic detecting element can be used for high track density recording on media.

The magnetic anisotropic field of a ferromagnetic layer depends on magnetocrystalline anisotropy, induced magnetic anisotropy, and magnetoelasticity. The present invention focuses on the magnetoelasticity, which determines the uniaxial anisotropy fixing the magnetization of the pinned magnetic layer.

The magnetoelasticity depends on magnetoelastic energy. The magnetoelastic energy is defined by the stress placed on the pinned magnetic layer and the magnetostriction coefficient $\lambda s$ of the pinned magnetic layer.

The side surface opposing the recording medium of the pinned magnetic layer is open and free from any component so that the symmetry of the stress is distorted. Thus, the pinned magnetic layer is subjected to a tensile stress in the direction of the height of the element (height direction, direction of the normal to the recording medium-opposing surface). The present invention increases the magnetostriction coefficient $\lambda s$ of the pinned magnetic layer to increase the magnetoelastic energy, thereby increasing the uniaxial anisotropy of the pinned magnetic layer. A large uniaxial anisotropy of the pinned magnetic layer can firmly fix the magnetization of the pinned magnetic layer in a specific direction. Consequently, the power of the magnetic detecting element is increased and the reliability and symmetry of the power are enhanced.

The pinned magnetic layer has an artificial ferrimagnetic structure including a plurality of magnetic layers separated by the nonmagnetic interlayer.

The magnetic layer located most distant from the nonmagnetic material layer, or the first magnetic layer, is provided with the nonmagnetic metal first magnetostriction-enhancing layer on its surface opposite to the nonmagnetic material layer, in contact with each other. The first magnetic layer and the first magnetostriction-enhancing layer are epitaxially or heteroepitaxially joined together, so that the crystal structure of the first magnetic layer is distorted to increase the magnetostriction coefficient $\lambda s$ of the first magnetic layer.

The nonmagnetic metal second magnetostriction-enhancing layer is disposed between the magnetic layer located closest to the nonmagnetic material layer, or the second magnetic layer, and the nonmagnetic material layer, in contact with the second magnetic layer.

The second magnetic layer and the second magnetostriction-enhancing layer are epitaxially or heteroepitaxially joined together, so that the crystal structure of the second magnetic layer is distorted to increase the magnetostriction coefficient $\lambda s$ of the second magnetic layer.

In the structure of the present invention, the upper and lower surfaces of the pinned magnetic layer lie between the first magnetostriction-enhancing layer and the second magnetostriction-enhancing layer.

The magnetic detecting element of the present invention is of a CPP type, which includes a multilayer composite constituted of a free magnetic layer, a nonmagnetic material layer, and a pinned magnetic layer in which current flows in the direction perpendicular to the surfaces of the layers. In CPP magnetic detecting elements, spin-dependent bulk scattering in the ferromagnetic layer plays an important role in enhancing the GMR effect. Even if a nonmagnetic metal layer (second magnetostriction-enhancing layer) made of a material different from that of the nonmagnetic material layer is provided between the pinned magnetic layer and the nonmagnetic material layer, the GMR effect is less degraded.

On the other hand, in CIP (current-in-the-plane) magnetic detecting elements in which current flows parallel to the surfaced of the layers of the multilayer composite, spin-dependent interface scattering plays an important role in enhancing the GMR effect. If a nonmagnetic metal second magnetostriction-enhancing layer is provided between the pinned magnetic layer and the nonmagnetic material layer, the GMR effect is extremely degraded.

It is possible that the upper and lower surfaces of the pinned magnetic layer are disposed between the nonmagnetic metal first magnetostriction-enhancing layer and second magnetostriction-enhancing layer without degrading the GMR effect, as long as the magnetic detecting element is of the CPP type. Thus, the magnetostriction coefficient of the pinned magnetic layer is increased from above and below to produce magnetoelasticity appropriately. The magnetization of the pinned magnetic layer is more firmly fixed. Consequently, magnetization of the pinned magnetic layer cannot be distorted by a longitudinal bias magnetic field from a hard bias layer, and accordingly the distortion and asymmetry of reproduction waveforms resulting from the fluctuations of the magnetization can be reduced. Also, the pinned magnetic layer is prevented from being reversed by electrostatic discharge. Thus, the performance and reliability of the resulting magnetic head can be enhanced.

Preferably, the second magnetostriction-enhancing layer has a larger lattice constant than the nonmagnetic material layer. This allows the crystals of the second magnetic layer to be appropriately distorted by atomic misalignment at the interface with the second magnetostriction-enhancing layer. Thus, the magnetostriction coefficient of the second magnetic layer can be increased effectively.

Preferably, the second magnetic layer has a positive spin-dependent bulk scattering coefficient.

The spin-dependent bulk scattering coefficient depends on the material. The second magnetic layer is preferably formed of a magnetic material leading to a positive spin-dependent bulk scattering coefficient.

Specifically, at least part of the second magnetic layer may be formed of a Heusler alloy expressed by $Co_2MnY$, wherein Y represents at least one element selected from the group consisting of Al, Si, Ga, Ge, and Sn. Alternatively, at least part of the second magnetic layer may be formed of a magnetic material selected from the group consisting of Co, CoFe, Co-Z, CoFe-Z, and Ni-Q, wherein Z represents at least one element selected from the group consisting of Ti, Zr, Ta, Hf, Sc, V, Mn, Y, and Nb, and Q represents at least one element selected from the group consisting of Rh, Ir, Be, Al, Si, Ga, Ge, Ti, Mn, Zn, Cd, and Sn.

The spin-dependent bulk scattering coefficient $\beta$ satisfies the relationship $\rho\downarrow/\rho\uparrow=(1+\beta)/(1-\beta)$, wherein $\rho\downarrow$ represents specific resistance to down-spin conduction electrons and $\rho\uparrow$ represents specific resistance to up-spin conduction electrons. $\beta$ is in the range of more than −1 to less than 1.

If the second magnetic layer is formed of a magnetic material leasing to a positive $\beta$ value, the relationship $\rho\downarrow>\rho\uparrow$ holds.

When the $\beta$ value is positive, the specific resistance $\rho\downarrow$ to down-spin conduction electrons increases, so that it becomes difficult for the down-spin conduction electrons to flow in the second magnetic layer or the down-spin conduction electrons are blocked out. Consequently, the spin diffusion length of the down-spin conduction electrons is reduced. On the other hand, the specific resistance $\rho\uparrow$ to up-spin conduction electrons decreases, so that it becomes easy for the up-spin conduction electrons to flow in the second magnetic layer. Consequently, the spin diffusion length of the up-spin conduction electrons is increased. Thus, the difference in spin diffusion length between the up-spin conduction electrons and the down-spin conduction electrons can be increased. By use of a magnetic material having a large $\beta$ value for the second magnetic layer, the difference in spin diffusion length can be increased to enhance the GMR effect more appropriately.

When the second magnetic layer has a positive spin-dependent bulk scattering coefficient $\beta$, it is preferable that the spin-dependent interface scattering coefficient $\gamma$ between the second magnetostriction-enhancing layer and the second magnetic layer be positive. A negative spin-dependent interface scattering coefficient $\gamma$ makes down-spin conduction electron flow easy at the interface, but makes up-spin conduction electron flow difficult. This counteracts the spin-dependent bulk scattering effect of increasing the spin diffusion length of up-spin conduction electrons in the second magnetic layer and reducing the spin diffusion length of down-spin conduction electron in second magnetic layer. Hence, the spin diffusion length is reduced and the GMR effect cannot be enhanced effectively. It is therefore preferable that the spin-dependent interface scattering coefficient $\gamma$ between the second magnetostriction-enhancing layer and the second magnetic layer be positive.

Preferably, the second magnetostriction-enhancing layer is formed of at least one material selected from the group consisting of Pt, Au, Pd, Ag, Ir, and Rh.

Preferably, the first magnetostriction-enhancing layer is formed of an alloy expressed by X—Mn, wherein X represents at least one element selected from the group consisting of Pt, Pd, Ir, Rh, Ru, Os, Ni, and Fe.

Preferably, the first magnetostriction-enhancing layer has a face-centered cubic (fcc) structure in its entirety or in the vicinity of the interface with the first magnetic layer, and equivalent crystal planes represented by {111} in the first magnetostriction-enhancing layer are preferentially oriented in the direction parallel to the interface.

The first magnetostriction-enhancing layer may contain at least one element of Ru, Mo, and W.

Preferably, the second magnetostriction-enhancing layer has a fcc structure in its entirety or in the vicinity of an interface with the second magnetic layer, and equivalent crystal planes represented by {111} in the second magnetostriction-enhancing layer are preferentially oriented in the direction parallel to the interface.

Preferably, at least one of the first magnetic layer and the second magnetostriction-enhancing layer has an fcc structure in its entirety or in the vicinity of an interface with the corresponding magnetostriction-enhancing layer, and equivalent crystal planes represented by {111} in the magnetic layer having the fcc structure are preferentially oriented in the direction parallel to the interface.

Thus, the first magnetostriction-enhancing layer and/or second magnetostriction-enhancing layer may have an fcc structure and its {111} equivalent crystal planes may be preferentially oriented in the direction parallel to the interface with the magnetostriction-enhancing layer.

This structure allows the atoms constituting the first magnetic layer and/or second magnetic layer and the atoms constituting the corresponding magnetostriction-enhancing layer to align readily in such a manner as to be stacked on top of one another.

Alternatively, at least one of the first magnetic layer and the second magnetic layer may have a body-centered cubic (bcc) structure in its entirety or in the vicinity of an interface with the corresponding magnetostriction-enhancing layer, and equivalent crystal planes represented by {110} in the magnetic layer having the bcc structure are preferentially oriented in the direction parallel to the interface.

Even if the first magnetic layer and/or second magnetic layer has a bcc structure and its {110} equivalent crystal planes are preferentially oriented in the direction parallel to the interface with the magnetostriction-enhancing layer, the atoms constituting the first magnetic layer and/or second magnetic layer and the atoms constituting the corresponding magnetostriction-enhancing layer are readily aligned in such a manner as to be stacked on top of one another.

In the CPP magnetic detecting element of the present invention, the upper and lower surfaces of the pinned magnetic layer having an artificial ferrimagnetic structure lie between nonmagnetic metal magnetostriction-enhancing layers.

Since the magnetic detecting element of the present invention is of a CPP type, a nonmagnetic metal layer (second magnetostriction-enhancing layer) made of a material different from that of the nonmagnetic material layer can be provided between the pinned magnetic layer and the nonmagnetic material layer without largely degrading the GMR effect.

The CPP structure in a magnetic detecting element allow the upper and lower surfaces of the pinned magnetic layer to lie between a nonmagnetic metal first magnetostriction-enhancing layer and second magnetostriction-enhancing layer, without degrading the GMR effect. Consequently, the magnetostriction coefficient of the pinned magnetic layer is increased from above and below to produce appropriate magnetoelasticity, and the magnetization of the pinned magnetic layer is more firmly fixed. Consequently, magnetization of the pinned magnetic layer is not distorted by a longitudinal bias magnetic field from a hard bias layer, and accordingly the distortion and asymmetry of reproduction waveforms resulting from the fluctuations of the magnetization can be reduced. Also, the pinned magnetic layer is prevented from being reversed by electrostatic discharge. Thus, the performance and reliability of the resulting magnetic head can be enhanced.

BRIEF DESCRIPTION OF THE DRAWINGS

FIG. 10 is a schematic fragmentary diagram of a known CPP magnetic detecting element viewed from a surface opposing a recording medium.

DESCRIPTION OF THE PREFERRED EMBODIMENTS

Figure 1:
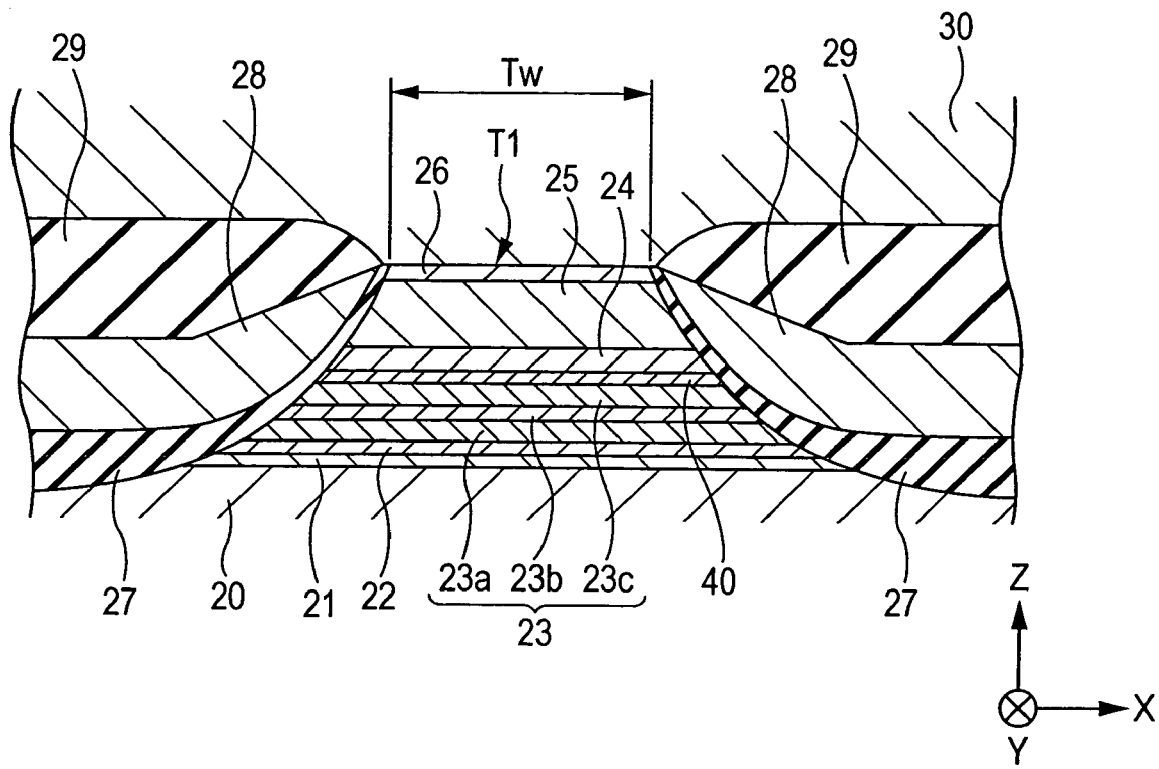
FIG. 1 is a sectional view of a magnetic detecting element according to a first embodiment of the present invention, viewed from a surface opposing a recording medium.
Figure 4:
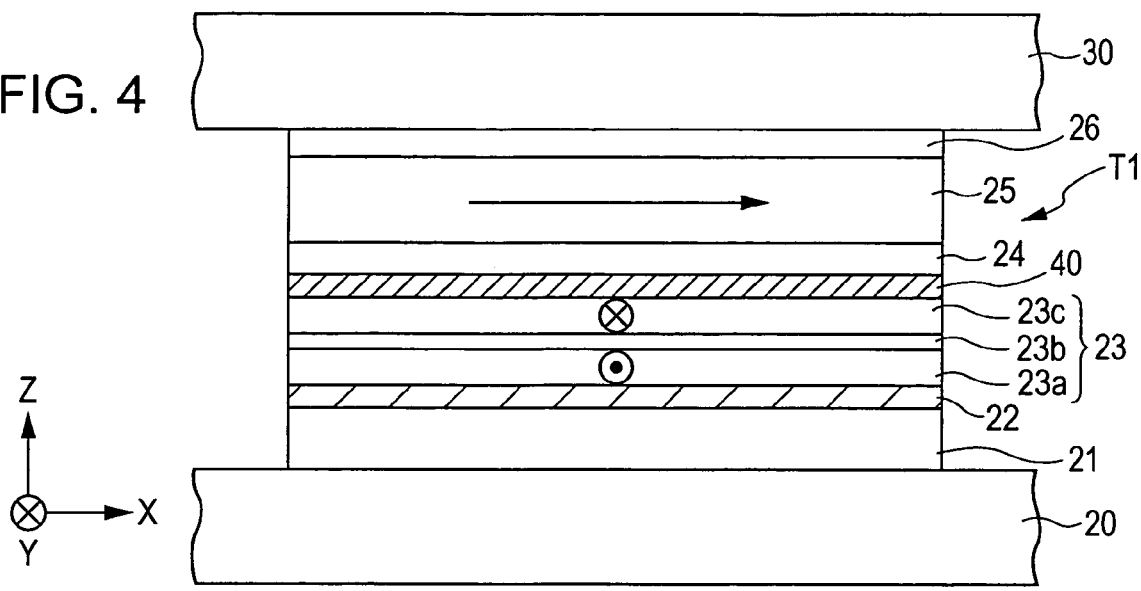
FIG. 4 is a schematic fragmentary diagram of the magnetic detecting element shown in FIG. 1.

FIG. 1 is a sectional view of a magnetic detecting element according to a first embodiment of the present invention, viewed from the side surface opposing the recording medium, and FIG. 4 is a fragmentary schematic diagram of the magnetic detecting element shown in FIG. 1.

The magnetic detecting element shown in FIGS. 1 and 4 has a multilayer composite T1 on a lower shield layer 20 made of a magnetic material.

The multilayer composite T1 is formed by depositing a seed layer 21, a first magnetostriction-enhancing layer 22, a pinned magnetic layer 23, a second magnetostriction-enhancing layer 40, a nonmagnetic material layer 24, a free magnetic layer 25, and a protective layer 26 in that order on the shield layer 20.

The seed layer 21 is formed of a NiFe alloy, a NiFeCr alloy, Cr, Ta, or the like. For example, the seed layer 21 is formed of 60 atomic percent of $Ni_{0.8}Fe_{0.2}$ and 40 atomic percent of Cr to a thickness of 35 to 60 Å.

The seed layer 21 helps the first magnetostriction-enhancing layer 22, which is formed of a nonmagnetic metal, have good {111} orientation.

The first magnetostriction-enhancing layer 22 will be described later.

The pinned magnetic layer 23 has an artificial ferrimagnetic structure including a first magnetic layer 23a and a second magnetic layer 23c separated by a nonmagnetic interlayer 23b made of, for example, Ru. The magnetization of the pinned magnetic layer 23 is fixed in the height direction (Y direction of the figure) by the uniaxial anisotropy of the pinned magnetic layer 23 itself.

The pinned magnetic layer 23 is covered with the second magnetostriction-enhancing layer 40, which is also formed of a nonmagnetic metal and will be described later.

The nonmagnetic material layer 24 is intended to prevent magnetic coupling between the pinned magnetic layer 23 and the free magnetic layer 25, and is preferably formed of an electrically conductive nonmagnetic material, such as Cu, Cr, Au, or Ag, to a thickness of 17 to 50 Å. A Cu nonmagnetic material layer 24 is particularly suitable.

The free magnetic layer 25 is formed of a magnetic material, such as a NiFe alloy or a CoFe alloy. In the structure shown in FIG. 1, if the free magnetic layer 25 is formed of a NiFe alloy, a diffusion-preventing layer (not shown) made of Co, a CoFe alloy, or the like is preferably provided between the free magnetic layer 25 and the nonmagnetic material layer 24. The thickness of the free magnetic layer 25 is 20 to 100 Å. The free magnetic layer 25 may have an artificial ferrimagnetic structure constituted of a plurality of magnetic layers, each separated by a nonmagnetic interlayer.

The protective layer 26 is formed of, for example, Ta or Ru, to a thickness of about 10 to 50 Å, and prevents the multilayer composite T1 from oxidizing.

In the first embodiment, a lower insulating layer 27, a hard bias layer 28, and an upper insulating layer 29 are deposited in that order at both sides of the multilayer composite T1 from the seed layer 21 to the protective layer 26, as shown in FIG. 1. A longitudinal bias magnetic field from the hard bias layer 28 orients the magnetization of the free magnetic layer 25 in the direction of the track width Tw (X direction in the figure).

A bias underlayer (not shown) may be provided between the lower insulating layer 27 and the hard bias layer 28. The bias underlayer is formed of, for example, Cr, W, a W—Ti alloy, or an Fe—Cr alloy.

The insulating layers 27 and 29 are formed of an insulating material, such as $Al_2O_3$ or $SiO_2$, and isolate the upper and lower surfaces of the hard bias layer 28 so as to prevent the current flowing perpendicular to the surfaces of the layers in the multilayer composite T1 from diverging to both sides of the track width direction.

The hard bias layer 28 is formed of, for example, a Co—Pt alloy or a Co—Cr—Pt alloy.

An upper shield layer 30 made of a magnetic material is deposited over the upper insulating layers 29 and the protective layer 26. The magnetic detecting element shown in FIGS. 1 and 4 is of a CPP type, and in which the lower shield layer 20 and the upper shield layer 30 serve as electrodes that supply the current flowing perpendicular to the surfaces of the layers in the multilayer composite T1.

The magnetization of the free magnetic layer 25 is oriented in the track width direction (X direction) by the longitudinal bias magnetic field from the hard bias layer 28, and the direction is sensitively changed according to the signal magnetic field (external magnetic field) of the recording medium. On the other hand, the magnetization of the pinned magnetic layer 23 is fixed in the height direction (Y direction).

The electrical resistance depends on the relationship in direction between the magnetization of the free magnetic layer 25 and the fixed magnetization of the pinned magnetic layer 23 (particularly the fixed magnetization of the second magnetic layer 23c). The leak magnetic field from the recording medium is detected by changes in voltage or current according to changes in electrical resistance.

The magnetic detecting element according to the first embodiment features the following:

The pinned magnetic layer 23 of the magnetic detecting element shown in FIG. 1 has an artificial ferrimagnetic structure including the first magnetic layer 23a and the second magnetic layer 23 separated by the nonmagnetic interlayer 23b made of Ru or the like. The first magnetic layer 23a and the second magnetic layer 23c are magnetized in directions antiparallel to each other by the Ruderman-Kittel-Kasuya-Yosida (RKKY) interaction with the nonmagnetic interlayer 23b disposed between the magnetic layers.

The first magnetic layer 23a lies most distant from the nonmagnetic material layer 24 in the magnetic layers of the pinned magnetic layer 23, and the nonmagnetic metal first magnetostriction-enhancing layer 22 is directly disposed on the surface opposite to the nonmagnetic material layer 24 of the first magnetic layer 23a.

The second magnetic layer 23c lies closest to the nonmagnetic material layer 24 in the magnetic layers of the pinned magnetic layer 23, and the nonmagnetic metal second magnetostriction-enhancing layer 40 is disposed between the second magnetic layer 23c and the nonmagnetic material layer 24, in contact with the second magnetic layer 23c.

Thus, the upper and lower surfaces of the pinned magnetic layer 23 lie between the first magnetostriction-enhancing layer 22 and the second magnetostriction-enhancing layer 40, as shown in FIGS. 1 and 4 (in FIG. 4, the magnetostriction-enhancing layers 22 and 40 are indicated by oblique lines).

The first embodiment involves the magnetoelasticity that determines the uniaxial anisotropy fixing the magnetization of the pinned magnetic layer 23.

The magnetoelasticity is controlled by magnetoelastic energy. The magnetoelastic energy is defined by the stress $\sigma$ placed on the pinned magnetic layer 23 and the magnetostriction coefficient $\lambda s$ of the pinned magnetic layer 23.

Figure 2:
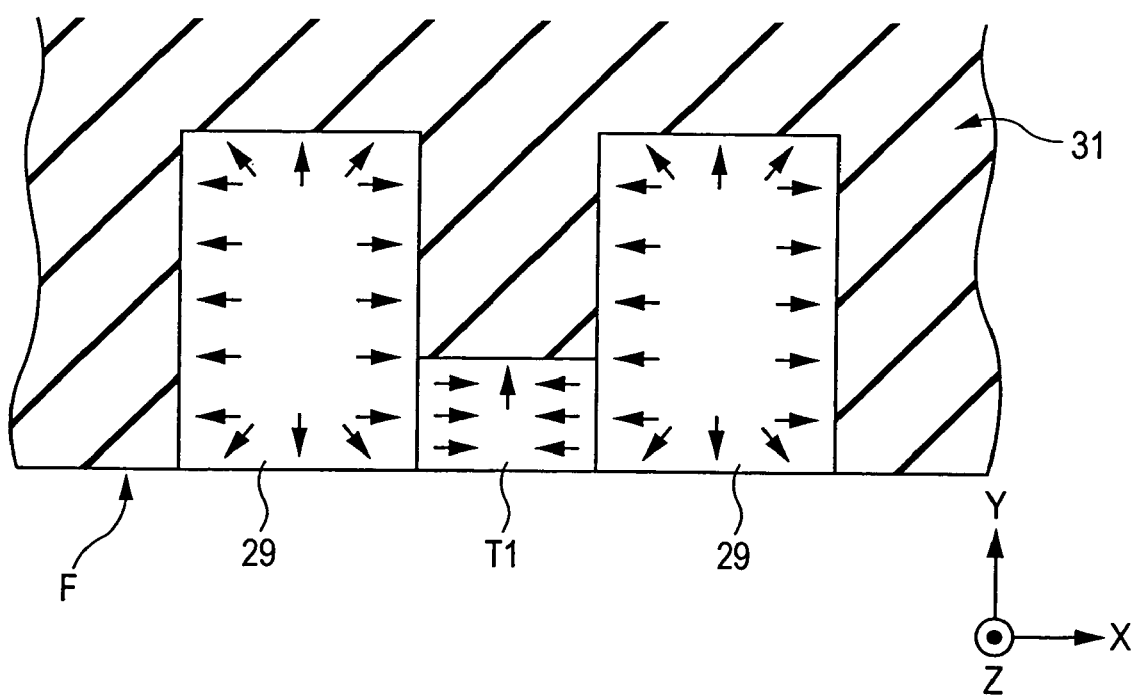
FIG. 2 is a plan view of the magnetic detecting element shown in FIG. 1.

FIG. 2 is a plan view of the magnetic detecting element shown in FIG. 1 when viewed from above (direction opposite to the Z direction). The multilayer composite T1 of the magnetic detecting element is disposed between a pair of units, each including the lower insulating layer 27, the hard bias layer 28, and the upper insulating layer 29. Since the lower insulating layer 27 and the hard bias layer 28 underlie the upper insulating layer 29, they are not shown in FIG. 2. The external region of the multilayer composite Ti and the two units including the lower insulating layer 27, the hard bias layer 28, and the upper insulating layer 29 are filled with another insulating layer 31 indicated by oblique lines.

The surface F opposing the recording medium, defined by ends of the multilayer composite T1, lower insulating layer 27, hard bias layer 28, and upper insulating layer 29 is exposed or covered with a thin protective layer made of, for example, diamond-like carbon (DLC) with a thickness of about 20 to 50 Å, and is open.

Consequently, the symmetry of the stress from the lower shield layer 20 and the upper shield layer 30, which is two-dimensionally isotropic originally, is distorted due to the open end surface F. As a result, a tensile stress is placed on the multilayer composite T1 in the height direction (Y direction). If the multilayer units including the lower insulating layer 27, the hard bias layer 28, and the upper insulating layer 29 have an internal compressive stress, the insulating layers 27 and 29 tend to extend in the in-plane direction, and a compressive stress is placed on the multilayer composite T1 in the directions parallel and antiparallel to the track width direction (X direction).

More specifically, a tensile stress in the height direction (Y direction) and a compressive stress in the track width direction (X direction) are applied to the pinned magnetic layer 23 having the open end surface F opposing the recording medium. The easy magnetization axes of the first magnetic layer 23a and the second magnetic layer 23c, which are formed of a magnetic material having a positive magnetostriction coefficient λs, are pointed to the back of the magnetic detecting element (in the height direction or Y direction) by the magnetoelasticity, so that the magnetizations of the first magnetic layer 23a and the second magnetic layer 23c are fixed in the direction parallel or antiparallel to the height direction. The RKKY interaction acting between the first magnetic layer 23a and the second magnetic layer 23c fixes the magnetization directions of the first magnetic layer 23a and the second magnetic layer 23c in antiparallel with each other.

In the first embodiment, the magnetostriction coefficient λs of the pinned magnetic layer 23 is set large to increase magnetoelastic energy so that the uniaxial anisotropy of the pinned magnetic layer 23 is increased. A larger uniaxial anisotropy of the pinned magnetic layer 23 can more firmly fix the magnetization of the pinned magnetic layer 23 in a specific direction. Thus, the power of the magnetic detecting element is increased with enhanced power stability and symmetry.

More specifically, the magnetostriction coefficients λs of the first magnetic layer 23a and the second magnetic layer 23c of the pinned magnetic layer 23 are increased by joining the first magnetic layer 23a to the first magnetostriction-enhancing layer 22, and the second magnetic layer 23c to the second magnetostriction-enhancing layer 40 so that the crystal structures of the first magnetic layer 23a and the second magnetic layer 23c are distorted.

By disposing the upper and lower surfaces of the pinned magnetic layer 23 between the first magnetostriction-enhancing layer 22 and the second magnetostriction-enhancing layer 40, as shown in FIGS. 1 and 4, the magnetostriction coefficients λs of both the first magnetic layer 23a and the second magnetic layer 23c can be appropriately increased. Thus, the magnetization of the pinned magnetic layer 23 can be firmly fixed.

In the present invention, the second magnetostriction-enhancing layer 40 is disposed between the second magnetic layer 23c and the nonmagnetic material layer 24. The CPP type among magnetic detecting elements allows this structure.

In CIP magnetic detecting elements, the GMR effect is closely related to spin-dependent interface scattering between the layers of the second magnetic layer/nonmagnetic material layer/free magnetic layer structure, and, in general, the material of each layer of the second magnetic layer/nonmagnetic material layer/free magnetic layer structure is selected so as to increase the spin-dependent interface scattering effect. For example, the second magnetic layer is formed of a CoFe alloy; the nonmagnetic material layer is formed of Cu; the free magnetic layer is formed with two layers formed of a CoFe alloy and a NiFe alloy (the layer adjoining the nonmagnetic material layer is formed of the CoFe alloy). In this instance, the spin-dependent interface scattering effect between the CoFe layer and the Cu layer is greatly high. If a nonmagnetic metal layer made of another material is disposed between the CoFe layer and the Cu layer, the spin-dependent interface scattering effect is rapidly reduced to degrade the GMR effect extremely.

It is therefore unsuitable for the CIP magnetic detecting element that a second magnetostriction-enhancing layer is disposed between the second magnetic layer and the nonmagnetic material layer as in the present invention, in view of the connection with the GMR effect.

For the CPP magnetic detecting element, although the spin-dependent interface scattering effect is a factor in increasing the magnetoresistance effect, the spin-dependent bulk scattering effect is more important.

Spin-dependent bulk scattering occurs inside a ferromagnetic layer, and is closely associated with how far conduction electrons run without changing their spins, that is, the spin diffusion length.

In the CPP magnetic detecting element according to the present invention, the nonmagnetic metal second magnetostriction-enhancing layer 40 disposed between the second magnetic layer 23c and the nonmagnetic material layer 24, as shown in FIG. 1, degrades the spin-dependent interface scattering effect, but produces an appropriate spin-dependent bulk scattering effect. Hence, the second magnetostriction-enhancing layer 40 does not rapidly degrade the GMR effect, in comparison with the CIP magnetic detecting element.

The structure in which the second magnetostriction-enhancing layer 40 lies between the second magnetic layer 23c and the nonmagnetic material layer 24, as shown in FIG. 1, is applicable only in CPP magnetic detecting elements.

Preferably, the second magnetostriction-enhancing layer 40 have a higher lattice constant than the second magnetic layer 23c and the first magnetostriction-enhancing layer 22 have a higher lattice constant than the first magnetic layer 23a.

Preferably, the first magnetostriction-enhancing layer 22, the second magnetostriction-enhancing layer 40, the first magnetic layer 23a, and the second magnetic layer 23c all have face-centered cubic lattice (fcc) structures, and their equivalent crystal planes represented by {111} are preferentially oriented in the direction parallel to their interfaces, from the viewpoint of enhancing the crystallinity. In this instance, the mismatch values is preferably set in the range of 0.05 to 0.20 which are defined by dividing the difference between the minimum interatomic distances in the {111} planes of the first magnetostriction-enhancing layer 22 and the first magnetic layer 23a by the minimum interatomic distance in the {111} plane of the first magnetic layer 23a or dividing the difference between the minimum interatomic distances in the {111} planes of the second magnetostriction-enhancing layer 40 and the second magnetic layer 23c by the minimum interatomic distance in the {111} plane of the second magnetic layer 23c.

Figure 3:
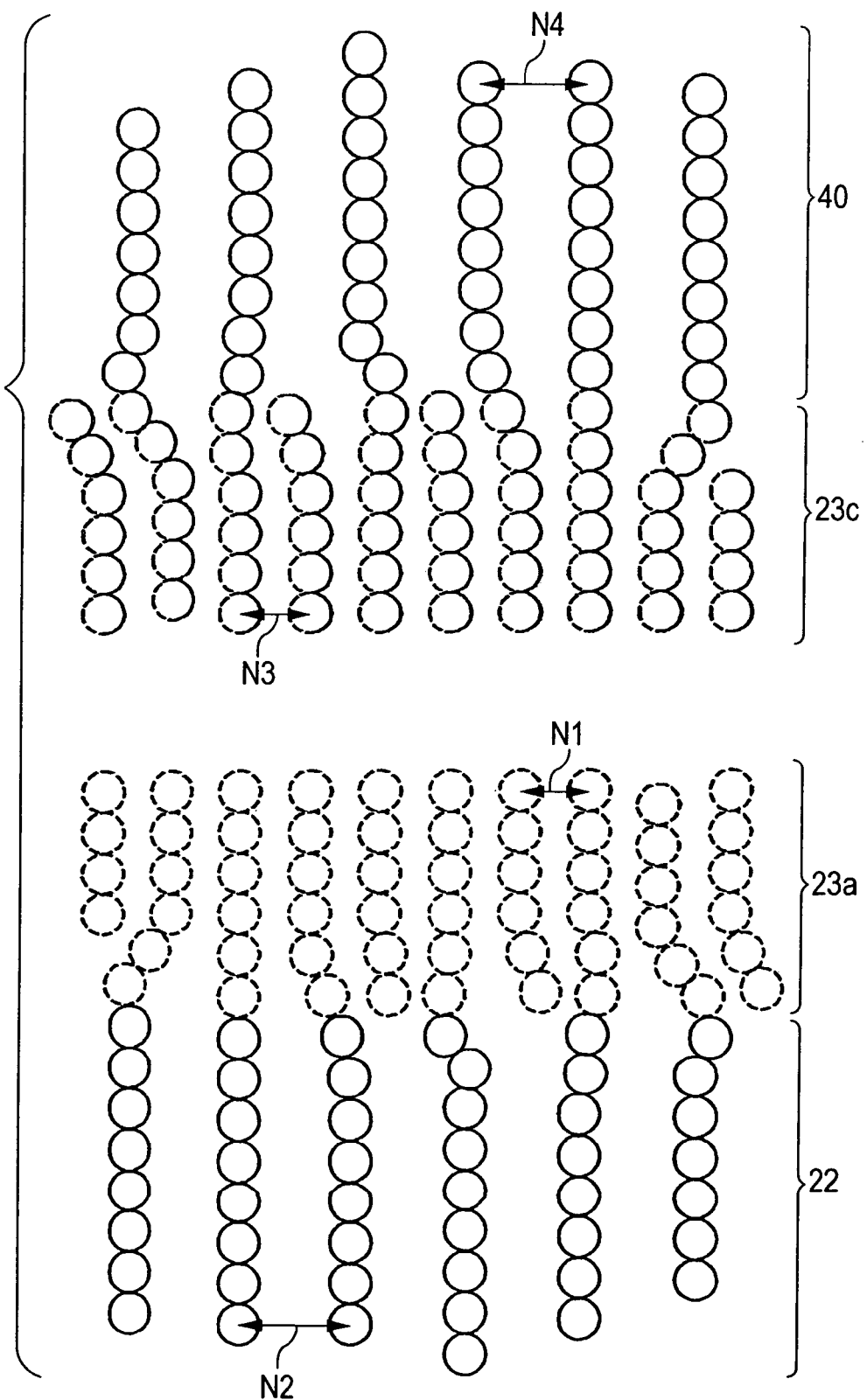
FIG. 3 is a schematic diagram of a state where distortion occurs in a magnetostriction-enhancing layer and a pinned magnetic layer with matching.

In the magnetic detecting element of the present embodiment, the atoms constituting the first magnetostriction-enhancing layer 22 and first magnetic layer 23a, and the atoms constituting the second magnetostriction-enhancing layer 40 and the second magnetic layer 23c are stacked on top of one another with the crystal structure distorted at the interface, as shown in FIG. 3.

Reference marks N1 and N3 in FIG. 3 represent the minimum interatomic distances in the {111} plane of the first magnetic layer 23a and the second magnetic layer 23c, respectively, and reference marks N2 and N4 represent the minimum interatomic distances in the {111} plane of the first magnetostriction-enhancing layer 22 and the second magnetostriction-enhancing layer 40, respectively. N1, N2, N3, and N4 are each measured at a position not affected by the distortion, distant from the interface between the first magnetostriction-enhancing layer 22 and the first magnetic layer 23a or between the second magnetostriction-enhancing layer 40 and the second magnetic layer 23c.

At least part of the crystals in the first magnetostriction-enhancing layer 22 and first magnetic layer 23a and at least part of the crystals in the second magnetostriction-enhancing layer 40 and second magnetic layer 23c grow epitaxially, as shown in FIG. 3. Consequently, the crystal structures of the first magnetic layer 23a and the second magnetic layer 23c are distorted, thereby increasing the magnetostriction coefficients λs of the first magnetic layer 23a and the second magnetic layer 23c.

In the present invention, it suffices that most of the atoms constituting the first magnetic layer 23a and first magnetostriction-enhancing layer 22 in the vicinity of their interface are in correct alignment in such a manner as to be stacked on top of one another, and that most of the atoms constituting the second magnetic layer 23c and second magnetostriction-enhancing layer 40 in the vicinity of their interface are in such correct alignment. For example, some of the atoms in the vicinity of the interfaces may not be aligned, as shown in FIG. 3. A few of the crystal grains constituting a polycrystal may be in a non-epitaxial misalignment.

If the second magnetostriction-enhancing layer 40 has a higher lattice constant than the second magnetic layer 23c, the crystal structure of the second magnetic layer 23c is distorted as shown in FIG. 3 and the magnetostriction coefficient λs of the second magnetic layer 23c is increased to enhance the magnetostriction, as described above. Preferably, the lattice constant of the second magnetostriction-enhancing layer 40 is, further, higher than that of the nonmagnetic material layer 24.

If the lattice constant of the second magnetostriction-enhancing layer 40 is lower than that of the nonmagnetic material layer 24, the crystal structure of the second magnetic layer 23c cannot be appropriately distorted, and accordingly the magnetostriction coefficient λs of the second magnetic layer 23C cannot be increased effectively. It is therefore preferable that the second magnetostriction-enhancing layer 40 be formed of a nonmagnetic metal having a higher lattice constant than the material of the nonmagnetic material layer 24.

The material of the second magnetostriction-enhancing layer 40 is selected in view of the lattice constant (minimum lateral interatomic distance at the interface). First, a nonmagnetic metal having a larger minimum interatomic distance than the second magnetic layer 23c and the nonmagnetic material layer 24 is selected for the second magnetostriction-enhancing layer 40. For example, the second magnetic layer 23c is formed of a Co-base alloy, a Ni-based alloy, a Heusler alloy, or the like and the nonmagnetic material layer 24 is formed of Cu or the like. Nonmagnetic metals having a larger lattice constant than that of the magnetic material constituting the second magnetic layer 23c and Cu constituting the nonmagnetic material layer 24 include Hf, Y, Nb, Rh, Ir, Al, Si, Ge, Zn, Cd, Ag, Au, Pd, Pt, and their alloys.

Nonmagnetic metals liable to become amorphous are not suitable. For example, Si, Hf, Zr, and Ta are liable to turn into amorphous alloys. A second magnetostriction-enhancing layer 40 formed of these nonmagnetic metals has a high specific resistance, disadvantageously. Also, amorphous metals do not achieve good lattice matching with the second magnetic layer 23c. Other materials are also unsuitable which have such a high lattice constant as to cause a mismatch in interatomic distance at a rate of 20% or more at the interface.

In the CPP magnetic detecting element shown in FIG. 1, spin-dependent bulk scattering plays an important role in the GMR effect. The spin-dependent bulk scattering coefficient (β value) of the second magnetic layer 23c, which contributes to the GMR effect, is preferably positive.

Magnetic materials leading to positive spin-dependent bulk scattering coefficients (β) include Co, CoFe, Co-Z, CoFe-Z (Z represents at least one element selected from the group consisting of Ti, Zr, Ta, Hf, Sc, V, Mn, Y, and Nb), and Ni-Q (Q represents at least one element selected from the group consisting of Rh, Ir, Be, Al, Si, Ga, Ge, Ti, Mn, Zn, Cd, and Sn).

These magnetic materials may be used for the first magnetic layer 23a of the pinned magnetic layer 23.

More preferably, the second magnetic layer 23c is formed of a Heusler alloy having a composition of $Co_2MnY$ (Y represents at least one element selected from the group consisting of Al, Si, Ga, Ge, and Sn).

The Heusler alloy has a positive spin-dependent bulk scattering coefficient β, and this value is relatively high (specifically, 0.7 or more). For the spin-dependent bulk scattering coefficient β, the relationship $\rho\downarrow/\rho\uparrow=(1+\beta)/(1-\beta)$ holds, wherein $\rho\downarrow$ represents the specific resistance to down-spin conduction electrons and $\rho\uparrow$ represents the specific resistance to up-spin conduction electrons.

A positive spin-dependent bulk scattering coefficient β results in a positive $\rho\downarrow/\rho\uparrow$, and hence leads to a relationship $\rho\downarrow>\rho\uparrow$. It becomes difficult for the down-spin conduction electrons to flow in the ferromagnetic layer, or they are blocked out. Consequently, the mean free path and spin diffusion length of the down-spin conduction electrons are reduced to show an insulated behavior. In contrast, it becomes easy for the up-spin conduction electrons to flow, and their mean free path and spin diffusion length are increased to show a metallic behavior. The differences in mean free path and spin diffusion length between the up-spin conduction electrons and the down-spin conduction electrons are increased. This phenomenon is called spin polarization. A Heusler alloy having a high β value allows strong spin polarization and further increases the differences in mean free path and spin diffusion length.

The variation in resistance (ΔR) and the rate of change in resistance (ΔR/R) each have a positive correlation with spin diffusion lengths of the up-spin and down-spin conduction electrons. By increasing the spin-dependent bulk scattering coefficient β to increase the difference in spin diffusion length between the up-spin conduction electrons and the down-spin conduction electrons, the ΔR value and the ΔR/R value can be increased. Thus, the resulting magnetic detecting element can be applied for high-density recording.

If the second magnetic layer 23c is formed of a magnetic material leading to a positive spin-dependent bulk scattering coefficient β, it is preferable that the spin-dependent interface scattering coefficient γ between the second magnetic layer 23c and the second magnetostriction-enhancing layer 40 be positive.

Accordingly, it is preferable that the second magnetostriction-enhancing layer 40 be formed of a nonmagnetic metal having a larger lattice constant than the lattice constants of the second magnetic layer 23c and the nonmagnetic material layer 40, and leading to a positive spin-dependent interface scattering coefficient γ at the interface with the second magnetic layer 23c.

Specifically, the second magnetostriction-enhancing layer 40 is preferably formed of at least one nonmagnetic metal selected from the group consisting of Pt, Au, Pd, Ag, Ir, and Rh.

The material of the first magnetostriction-enhancing layer 22 will be described below. The first magnetostriction-enhancing layer 22 needs to be formed of a nonmagnetic metal having a higher lattice constant than that of the first magnetic layer 23a. Since the second magnetostriction-enhancing layer 40 is directly related to the GMR effect, its material needs to satisfy various requirements and there is only a narrow range of choices in material. In contrast, the first magnetostriction-enhancing layer 22 is not directly related to the GMR effect. For example, even if the spin-dependent interface scattering coefficient γ is negative between the first magnetostriction-enhancing layer 22 and the first magnetic layer 23a, it does not directly affect the GMR effect. Accordingly, the material of the first magnetostriction-enhancing layer 22 can be selected in a wider range than the material of the second magnetostriction-enhancing layer 40.

For example, the first magnetostriction-enhancing layer 22 may be formed of at least one nonmagnetic material, such as Pt, Au, Pd, Ag, Ir, or Rh, as in the second magnetostriction-enhancing layer 40, or may contain at least one material leading to a negative spin-dependent interface scattering coefficient γ, such as Ru, Re, Mo, or W.

Alternatively, the first magnetostriction-enhancing layer 22 may be formed of an X—Mn alloy (X represents at least one element selected from the group consisting of Pt, Pd, Ir, Rh, Ru, Os, Ni, and Fe). The X—Mn alloy is not suitable for the second magnetostriction-enhancing layer 40. This alloy has a higher specific resistance than Pt and similar metals.

The first magnetostriction-enhancing layer 22 has a thickness of about 5 to 50 Å.

The thickness in this range allows the X—Mn first magnetostriction-enhancing layer 22 to maintain its initial crystal structure or face-centered cubic structure (fcc). A thickness of the first magnetostriction-enhancing layer 22 of more than 50 Å is not suitable. If heat of 250° C. or more is applied to the first magnetostriction-enhancing layer 22 with such a large thickness, the crystal structure is changed into a regular CuAuI-type face-centered tetragonal structure (fct). However, even the first magnetostriction-enhancing layer 22 with a large thickness of more than 50 Å can maintain its initial face-centered cubic structure (fcc), as long as heat of 250° C. or more is not applied.

If the first magnetostriction-enhancing layer 22 is formed of an X—Mn alloy, it is preferable that the X content in the X—Mn alloy be in the range of 45 to 99 atomic percent. An X content in this range stabilizes the magnetostriction of the first magnetic layer 23a with a large value.

The thicknesses of the second magnetostriction-enhancing layer 40 and the first magnetostriction-enhancing layer 22 will be described below. Preferably, the second magnetostriction-enhancing layer 40, which is directly related to the GMR effect, has a smaller thickness than the first magnetostriction-enhancing layer 22, which does not affect the GMR effect.

A second magnetostriction-enhancing layer 40 with a small thickness is liable to have a pinhole. The pinhole in the second magnetostriction-enhancing layer 40 does not much affect the effect of the invention. However, if the thickness of the second magnetostriction-enhancing layer 40 is excessively reduced to an extent that many pinholes are formed, the magnetostriction of the second magnetic layer 23c cannot be appropriately increased, and accordingly the magnetostriction coefficient λs is not increased.

Thus, the thickness of the second magnetostriction-enhancing layer 40 is preferably in the range of 3 to 15 Å.

Preferably, at least one of the magnetostriction-enhancing layers 22 and 40 has a face-centered cubic (fcc) structure in its entirety or in the vicinity of the interface with the corresponding magnetic layer 23a or 23c, and the equivalent crystal planes represented by {111} in the fcc magnetostriction-enhancing layer are preferentially oriented in the direction parallel to the interface.

Preferably, at least one of the magnetic layers 23a and 23c of the pinned magnetic layer 23 has a face-centered cubic (fcc) structure in its entirety or in the vicinity of the interface with its corresponding magnetostriction-enhancing layer 22 or 40, and the equivalent crystal planes represented by {111} in the fcc magnetic layer are preferentially oriented in the direction parallel to the interface.

Such a crystalline orientation facilitates the alignment of the atoms constituting the first magnetic layer 23a and first magnetostriction-enhancing layer 22 and the atoms constituting the second magnetic layer 23c and second magnetostriction-enhancing layer 40, and thus readily allows the crystals in the first and second magnetostriction-enhancing layers 22 and 40 and the pinned magnetic layer 23 to grow epitaxially.

Alternatively, at least one of the magnetic layers 23a and 23c may have a body-centered cubic (bcc) structure in its entirety or in the vicinity of the interface with its corresponding magnetostriction-enhancing layer 22 or 40, and the equivalent crystal planes represented by {110} in the bcc magnetic layer are preferentially oriented in the direction parallel to the interface.

In this instance, preferably the first magnetostriction-enhancing layer 22 and the second magnetostriction-enhancing layer 40 have a fcc structure in their entirety or in the vicinity of the interfaces with their respective magnetic layers 23a and 23c, and the equivalent crystal planes represented by {111} in the magnetostriction-enhancing layers are preferentially oriented in the direction parallel to the interfaces.

The atomic arrangement of the {110} equivalent crystal planes in the bcc structure is similar to that of the {111} equivalent crystal planes in the fcc structure. Crystals in the bcc structure and crystals in the fcc structure are aligned in such a manner that the atoms are stacked on top of one another or in a so-called heteroepitaxial manner.

Figure 5:
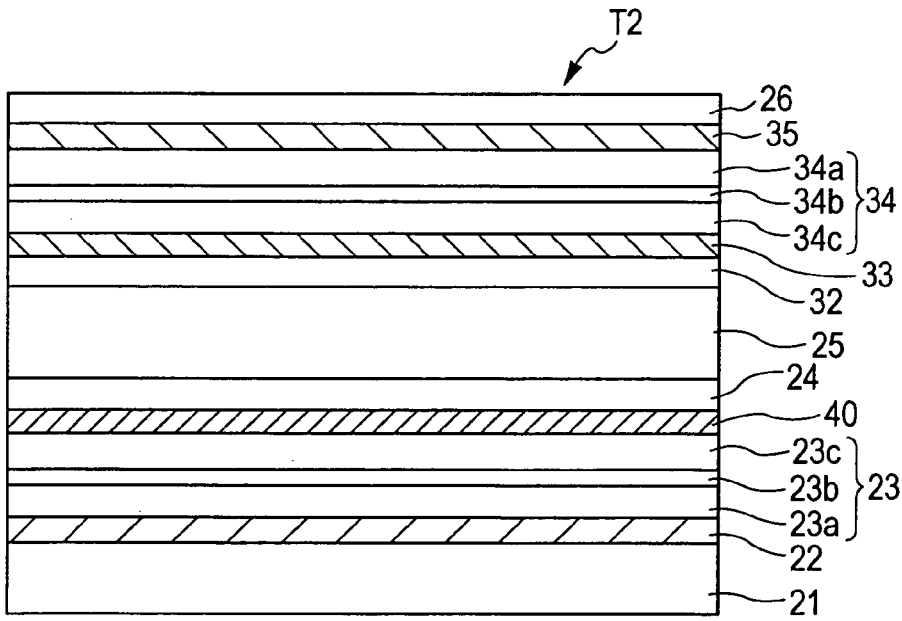
FIG. 5 is a schematic fragmentary diagram of a magnetic detecting element according to a second embodiment of the present invention, viewed from a surface opposing a recording medium.

FIG. 5 is a schematic diagram of another multilayer composite T2 having a different structure from the multilayer composite T1 of the CPP magnetic detecting element shown in FIG. 1. The multilayer composite T2 shown in FIG. 5 has a so-called dual spin-valve structure including nonmagnetic material layers 24 and 32 separated by a free magnetic layer 25, second magnetostriction-enhancing layers 40 and 33 under or on the respective nonmagnetic material layers 24 and 32, pinned magnetic layers 23 and 34 under or on the respective second magnetostriction-enhancing layers 40 and 33, first magnetostriction-enhancing layers 22 and 35 under or on the respective pinned magnetic layers 23 and 34, and a seed layer 21 under the lower first magnetostriction-enhancing layer 22 and a protective layer 26 on the surface of the upper first magnetostriction-enhancing layer 35. The pinned magnetic layers 23 and 34 have artificial ferrimagnetic structures respectively including second magnetic layers 23c and 34c, nonmagnetic interlayers 23b and 34b, and first magnetic layers 23a and 34a.

Figure 6:
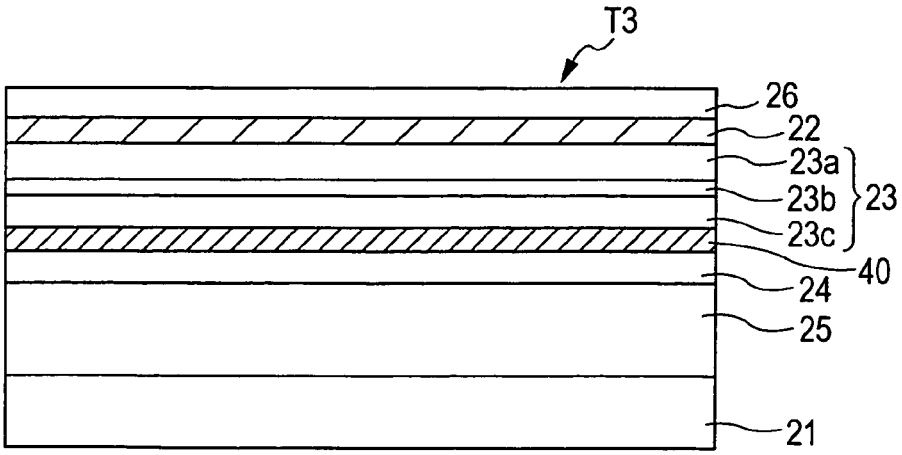
FIG. 6 is a schematic fragmentary diagram of a magnetic detecting element according to a third embodiment of the present invention, viewed from a surface opposing a recording medium.

FIG. 6 is a schematic diagram of another multilayer composite T3 having a different structure from the multilayer composite T1 of the CPP magnetic detecting element shown in FIG. 1. The multilayer composite T3 shown in FIG. 6 includes a free magnetic layer 25, a second magnetostriction-enhancing layer 40, a nonmagnetic material layer 24, a pinned magnetic layer 23, a first magnetostriction-enhancing layer 22, and a protective layer 26 in that order on a seed layer 21. The pinned magnetic layer 23 has an artificial ferrimagnetic structure formed by depositing a second magnetic layer 23c, a nonmagnetic interlayer 23b, and a first magnetic layer 23a, in that order from below. This multilayer composite T3 is deposited in inverse order to the multilayer composite T1 shown in FIG. 1; hence, the free magnetic layer 25 underlies the pinned magnetic layer 23.

The magnetic detecting elements shown in FIGS. 5 and 6 are of CPP types, and the multilayer composites T2 and T3 are each provided with shield layers 20 and 30 doubling as electrodes at their top and bottom in the same manner as in FIG. 1.

In FIGS. 5 and 6, the magnetostriction-enhancing layers are indicated by oblique lines.

In the multilayer composites T2 and T3 shown in FIGS. 5 and 6, as well as in FIG. 1, the second magnetostriction-enhancing layer 40 (33) is disposed between the second magnetic layer 23c (34c) of the pinned magnetic layer 23 (34) and the nonmagnetic material layer 24 (32), in contact with the second magnetic layer 23c (34c). Also, the first magnetostriction-enhancing layer 22 (35) is disposed on the surface opposite to the nonmagnetic material layer 24 (32) of the first magnetic layer 23a (34a) of the pinned magnetic layer 23(34), in contact with the first magnetic layer 23a (34a). Thus, the upper and lower surfaces of the pinned magnetic layer 23(34) lie between the magnetostriction-enhancing layers 22 and 40 (33 and 35).

This structure allows the magnetostriction of the pinned magnetic layer 23 (34) to increase from the upper and the lower side, and thus produces an appropriate magnetoelasticity to firmly fix the magnetization of the pinned magnetic layer 23 (34). Consequently, the magnetization of the pinned magnetic layer 23(34) is not distorted by a longitudinal bias magnetic field from a hard bias layer, and accordingly the distortion and asymmetry of reproduction waveforms resulting from fluctuations of the magnetization can be reduced. Also, the pinned magnetic layer 23 (34) is prevented from being reversed by electrostatic discharge (ESD) or the like. Thus, the structures as shown in FIGS. 5 and 6 can achieve a high-performance magnetic head with high reliability.

The materials and crystalline orientation of the magnetostriction-enhancing layers and pinned magnetic layer are the same as in FIG. 1.

Figure 7:
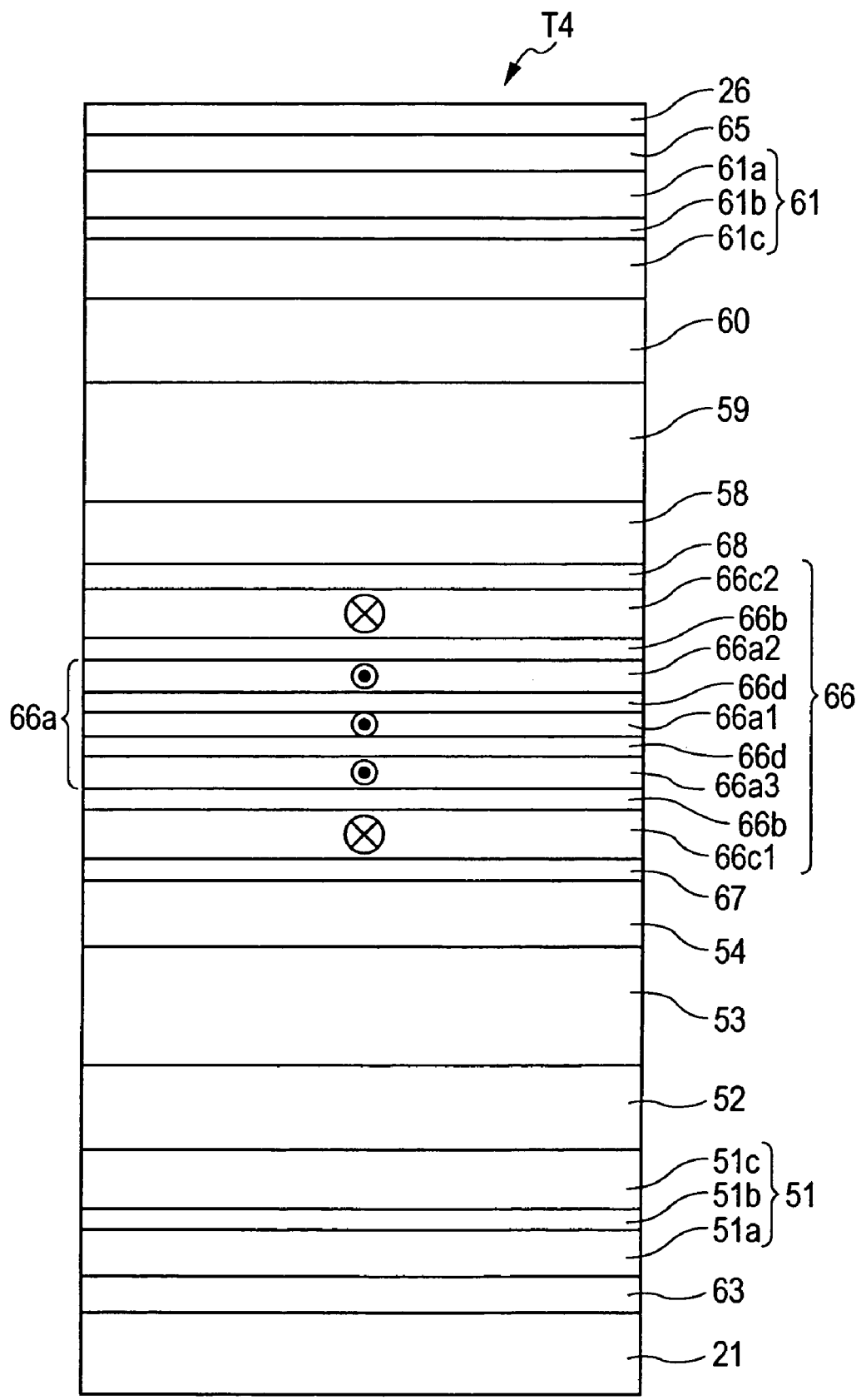
FIG. 7 is a schematic fragmentary diagram of a magnetic detecting element according to a fourth embodiment of the present invention, viewed from a surface opposing a recording medium.

FIG. 7 is a schematic diagram of another multilayer composite T4 having a different structure from the multilayer composite T1 of the CPP magnetic detecting element shown in FIG. 1.

Figure 8:
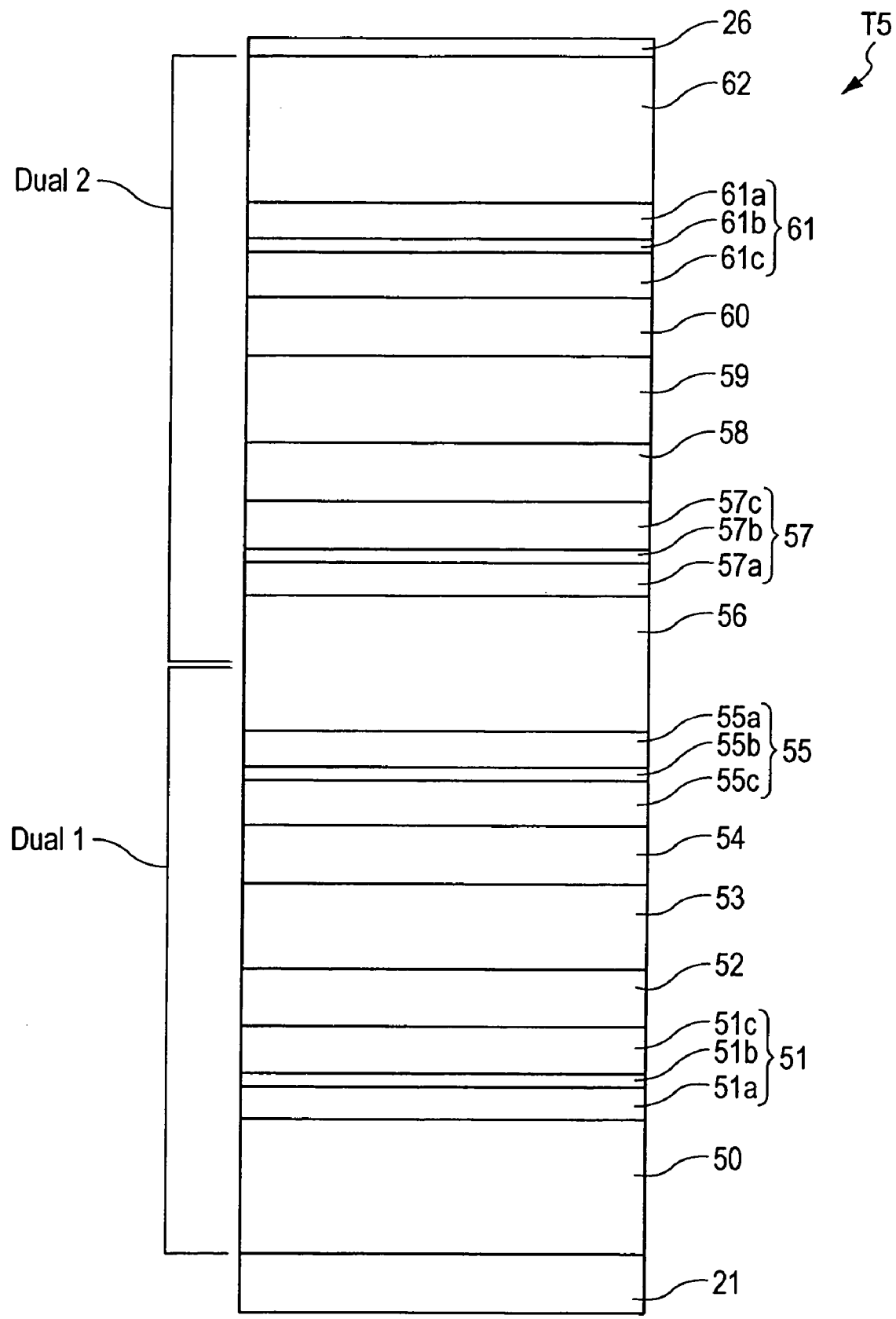
FIG. 8 is a schematic fragmentary diagram of a magnetic detecting element for comparison with the magnetic detecting element shown in FIG. 7, viewed from a surface opposing a recording medium.
Figure 9:
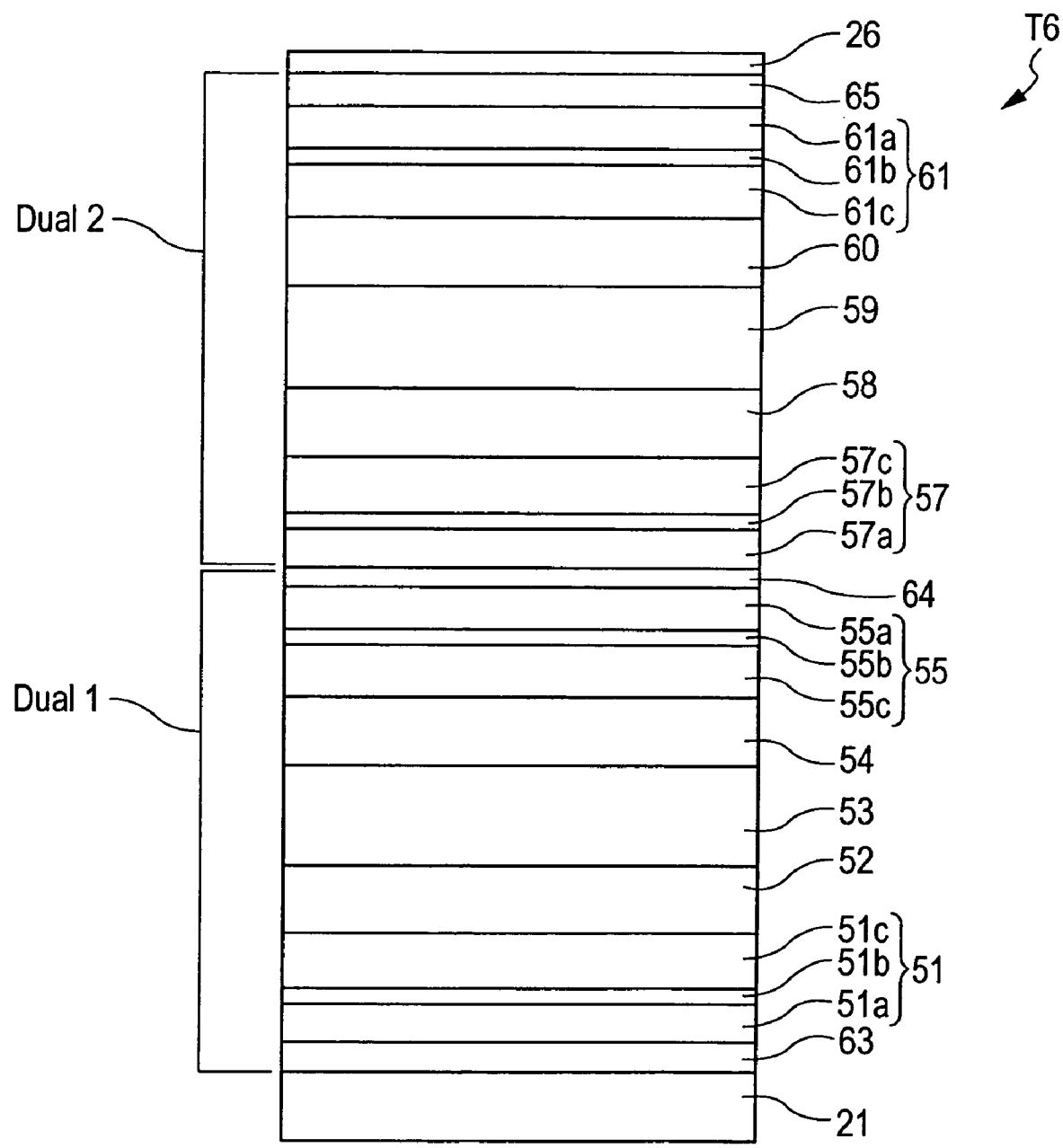
FIG. 9 is a schematic fragmentary diagram of another magnetic detecting element for comparison with the magnetic detecting element shown in FIG. 7, viewed from a surface opposing a recording medium.

Prior to the description of the multilayer composite T4 shown in FIG. 7, multilayer composites T5 and T6 shown in FIGS. 8 and 9 will be described for comparison. FIGS. 8 and 9 show the structures of comparative multilayer composites T5 and T6, respectively.

The multilayer composite T5 shown in FIG. 8 includes a seed layer 21, a first antiferromagnetic layer 50, a pinned magnetic layer 51, a nonmagnetic material layer 52, a free magnetic layer 53, a nonmagnetic material layer 54, a pinned magnetic layer 55, a second antiferromagnetic layer 56, a pinned magnetic layer 57, a nonmagnetic material layer 58, a free magnetic layer 59, a nonmagnetic material layer 60, a pinned magnetic layer 61, a third antiferromagnetic layer 62, and a protective layer 26, which are deposited in that order from below. The four pinned magnetic layers each have an artificial ferrimagnetic structure.

In this multilayer composite T5 show in FIG. 8, the layers from the lowermost antiferromagnetic layer or first antiferromagnetic layer 50 to second antiferromagnetic layer 56 lying in about the middle of the multilayer composite T5 define a first dual spin-valve structure (Dual 1), and the layers from the second antiferromagnetic layer 56 to the uppermost antiferromagnetic layer or third antiferromagnetic layer 62 define a second dual spin-valve structure (Dual 2).

Thus, the multilayer composite T5 shown in FIG. 8 has two dual spin-valve structures stacked on top of one the other.

The multilayer composite T5 can produce the GMR effect in CPP magnetic detecting elements using spin-dependent bulk scattering. However, the structure shown in FIG. 8 has three antiferromagnetic layers 50, 56, and 62 with large thicknesses and high specific resistances, and these antiferromagnetic layers generate Joule heat to cause lattice vibration and electromigration. Consequently, the GMR effect and the reproduction power cannot be appropriately enhanced.

In the multilayer composite T6 shown in FIG. 9, the antiferromagnetic layers 50, 56, and 62 shown in FIG. 8 are replaced with first magnetostriction-enhancing layers 63, 64, and 65. The first magnetostriction-enhancing layers 63, 64, and 65 are formed of, for example, a PtMn alloy. In the multilayer composite T6, the first magnetic layers 51a, 55a, 57a, and 61a of the pinned magnetic layers 51, 55, 57, and 61 are defined by the magnetic layers most distant from the respective nonmagnetic material layers 52, 54, 58, and 60, and the first magnetostriction-enhancing layers 63, 64, and 65 are disposed in contact with the respective first magnetic layers 51a, 55a, 57a, and 61a. Thus, the uniaxial anisotropies of the pinned magnetic layers 51, 55, 57, and 61 are increased by use of inverse magnetostriction, thereby fixing their magnetizations.

By use of the thin first magnetostriction-enhancing layers 63, 64, and 65, as in the multilayer composite T6 shown in FIG. 9, instead of the antiferromagnetic layers 50, 56, and 62 used in the multilayer composite T5 shown in FIG. 8, the GMR effect and the reproduction power can be increased.

Even in the structure shown in FIG. 9, however, the first magnetostriction-enhancing layer 64 lying in about the middle of the multilayer composite T6 needs to have a large thickness to some extent in order to magnetically separate the overlying and underlying dual spin-valve structures (Dual 1 and Dual 2).

If the first magnetostriction-enhancing layers 63, 64, and 65 are formed of a material having a relatively high specific resistance, such as a PtMn alloy, they can generate heat. The magnetostriction-enhancing layer 64 in about the middle of the multilayer composite T6 does not efficiently dissipate the heat because it is quite distant from the upper and lower electrodes, and the Joule heat from the first magnetostriction-enhancing layer 64 causes lattice vibration and electromigration to degrade the GMR effect and the reproduction power. Furthermore, in the structure shown in FIG. 9, the magnetostriction coefficient λs is increased only in the first magnetic layers 51a, 55a, 57a, and 61a among the magnetic layers of the pinned magnetic layers 51, 55, 57, and 61. It is desired to further increase the magnetostriction coefficients λs of the pinned magnetic layers 51, 55, 57, and 61 in a CPP structure.

Accordingly, an embodiment shown in FIG. 7 is provided. The multilayer composite T4 according to this embodiment includes a pinned magnetic layer composed of 9 sublayers in the middle of the multilayer composite T4, and second magnetostriction-enhancing layers, nonmagnetic material layers, free magnetic layers, nonmagnetic material layers, pinned magnetic layers, and first magnetostriction-enhancing layers over and under the 9-layer pinned magnetic layer.

As shown in FIG. 7, a first magnetostriction-enhancing layer 63, a pinned magnetic layer 51, a nonmagnetic material layer 52, a free magnetic layer 53, and a nonmagnetic material layer 54 are deposited in that order on a seed layer 21, as in the multilayer composite shown in FIG. 9.

While the structure shown in FIG. 9 has two pinned magnetic layers 55 and 57 disposed over the nonmagnetic material layer 54, magnetically separated by the first magnetostriction-enhancing layer 64, the structure shown in FIG. 7 has only one pinned magnetic layer 66 composed of many sublayers over the nonmagnetic material layer 54.

The 9-layer pinned magnetic layer 66 includes a 5-layer first magnetic layer 66a composed of three magnetic sublayers 66a1, 66a2, and 66a3 and magnetostriction-enhancing layers 66d each disposed between the magnetic sublayers. Each magnetostriction-enhancing layer 66d has such a small thickness as to allow ferromagnetic coupling between the magnetic sublayers without magnetically separating them. Consequently, the magnetic sublayers 66a1, 66a2, and 66a3 are all magnetized in the same direction.

Second magnetic layers 66c1 and 66c2 are disposed over and under the first magnetic layer 66a, each separated by a nonmagnetic interlayer 66b made of Ru or the like. Thus the 9-layer pinned magnetic layer 66 is structured, as shown in FIG. 7.

Second magnetostriction-enhancing layers 67 and 68 are disposed between the second magnetic layer 66c1 being the lowermost layer of the pinned magnetic layer 66 and the nonmagnetic material layer 54 and between the second magnetic layer 66c2 being the uppermost layer of the pinned magnetic layer 66 and the nonmagnetic material layer 58.

The layers over the nonmagnetic material layer 58 are disposed in this order: a free magnetic layer 59, a nonmagnetic material layer 60, a pinned magnetic layer 61, a first magnetostriction-enhancing layer 65, and a protective layer 26 in that order, as in the structure shown in FIG. 9.

The multilayer composite T6 shown in FIG. 9 has the two magnetically separated pinned magnetic layers 55 and 57 in about the middle. In the multilayer composite T4 shown in FIG. 7, these pinned magnetic layers 55 and 57 are combined into the single pinned magnetic layer 66 in about the middle of the structure. By forming the first magnetic layer 66a of the pinned magnetic layer 66 with the three magnetic sublayers separated by the very thin magnetostriction-enhancing layers 66d, as shown in FIG. 7, the magnetostriction coefficient of the first magnetic layer 66a can be increased, and the first magnetostriction-enhancing layer 64 with a relatively large thickness shown in FIG. 9 becomes unnecessary.

By respectively providing second magnetostriction-enhancing layers 67 and 68 between the second magnetic layers 66c1 and 66c2 and the respective nonmagnetic material layers 54 and 58, the magnetostriction coefficients of the second magnetic layers 66c1 and 66c2 can be increased as well.

Thus, the structure shown in FIG. 7 makes it possible to eliminate heat source layers to prevent the generation of Joule heat, in comparison with the structure shown in FIG. 9. Thus, lattice vibration and electromigration due to the Joule heat can be prevented to suppress the degradation of the GMR effect. In addition, the magnetization of the pinned magnetic layer 66 can be fixed more appropriately to enhance and stabilize the GMR effect and reproduction power.

In the multilayer composite T4 shown in FIG. 7, it is more preferable that second magnetostriction-enhancing layers be further provided between the second magnetic layer 51c of the pinned magnetic layer 51 and the nonmagnetic material layer 52 and between the second magnetic layer 61c of the pinned magnetic layer 61 and the nonmagnetic material layer 60, from the viewpoint of firmly fixing the magnetizations of the pinned magnetic layers 51 and 61.

What is claimed is:

1. A magnetic detecting element comprising:
a multilayer composite constituted of a plurality of layers in which current flows in a direction perpendicular to the surfaces of the layers, the multilayer composite comprising:
a free magnetic layer,
a nonmagnetic material layer;
a pinned magnetic layer including a plurality of magnetic layers and at least one nonmagnetic interlayer separating the magnetic layers from one another, the magnetic layers including a first magnetic layer located most distant from the nonmagnetic material layer and a second magnetic layer located closest to the nonmagnetic material layer;
a first magnetostriction-enhancing layer made of a nonmagnetic metal, disposed on the surface opposite to the nonmagnetic material layer of the first magnetic layer; and
a second magnetostriction-enhancing layer made of a nonmagnetic metal, disposed between the second magnetic layer and the nonmagnetic material layer, in contact with the second magnetic layer,
wherein the upper surface and the lower surface of the pinned magnetic layer lie between the first magnetostriction-enhancing layer and the second magnetostriction-enhancing layer; at least part of crystals in the first magnetostriction-enhancing layer and the first magnetic layer and at least part of crystals in the second magnetostriction-enhancing layer and the second magnetic layer are present in an epitaxial state or a heteroepitaxial state; and the surface opposing a recording medium of the pinned magnetic layer is open.

2. The magnetic detecting element according to claim 1, wherein the second magnetostriction-enhancing layer has a larger lattice constant than the lattice constant of the nonmagnetic material layer.

3. The magnetic detecting element according to claim 1, wherein the second magnetic layer has a positive spin-dependent bulk scattering coefficient.

4. The magnetic detecting element according to claim 3, wherein at least part of the second magnetic layer comprises a Heusler alloy expressed by $Co_2MnY$, wherein Y represents at least one element selected from the group consisting of Al, Si, Ga, Ge, and Sn.

5. The magnetic detecting element according to claim 3, wherein at least part of the second magnetic layer comprises a magnetic material selected from the group consisting of Co, CoFe, Co-Z, CoFe-Z, and Ni-Q, wherein Z represents at least one element selected from the group consisting of Ti, Zr, Ta, Hf, Sc, V, Mn, Y, and Nb, and Q represents at least one element selected from the group consisting of Rh, Ir, Be, Al, Si, Ga, Ge, Ti, Mn, Zn, Cd, and Sn.

6. The magnetic detecting element according to claim 3, wherein the interface between the second magnetostriction-enhancing layer and the second magnetic layer has a positive spin-dependent interface scattering coefficient.

7. The magnetic detecting element according to claim 6, wherein the second magnetostriction-enhancing layer comprises at least one material selected from the group consisting of Pt, Au, Pd, Ag, Ir, and Rh.

8. The magnetic detecting element according to claim 1, wherein the first magnetostriction-enhancing layer comprises an alloy expressed by X—Mn, wherein X represents at least one element selected from the group consisting of Pt, Pd, Ir, Rh, Ru, Os, Ni, and Fe.

9. The magnetic detecting element according to claim 1, wherein the first magnetostriction-enhancing layer has a face-centered cubic structure in the entirety thereof or in the vicinity of an interface with the first magnetic layer, and equivalent crystal planes represented by {111} in the first magnetostriction-enhancing layer are preferentially oriented in the direction parallel to the interface.

10. The magnetic detecting element according to claim 1, wherein the first magnetostriction-enhancing layer contains at least one element selected from the group consisting of Ru, Mo, and W.

11. The magnetic detecting element according to claim 1, wherein the second magnetostriction-enhancing layer has a face-centered cubic structure in the entirety thereof or in the vicinity of an interface with the second magnetic layer, and equivalent crystal planes represented by {111} in the second magnetostriction-enhancing layer are preferentially oriented in the direction parallel to the interface.

12. The magnetic detecting element according to claim 1, wherein at least one of the first magnetic layer and the second magnetic layer has a face-centered cubic structure in the entirety thereof or in the vicinity of an interface with the corresponding magnetostriction-enhancing layer, and equivalent crystal planes represented by {111} in the face-centered cubic structure are preferentially oriented in the direction parallel to the interface.

13. The magnetic detecting element according to claim 1, wherein at least one of the first magnetic layer and the second magnetic layer has a body-centered cubic structure in the entirety thereof or in the vicinity of an interface with the corresponding magnetostriction-enhancing layer, and equivalent crystal planes represented by {110} in the body-centered cubic structure are preferentially oriented in the direction parallel to the interface.

* * * * *